(12) United States Patent
Zhang et al.

(10) Patent No.: US 10,733,339 B2
(45) Date of Patent: Aug. 4, 2020

(54) VEHICLE BODY COMPOSITE COATING AND DESIGN METHOD THEREOF

(71) Applicant: CRRC QINGDAO SIFANG CO., LTD., Qingdao, Shandong (CN)

(72) Inventors: Shixin Zhang, Shandong (CN); Xiaocheng Wang, Shandong (CN); Chuantian Wu, Shandong (CN); Zhanling Zhang, Shandong (CN); Shitao Li, Shandong (CN); Wen Li, Shandong (CN); Lichun Meng, Shandong (CN); Shaoqing Liu, Shandong (CN); Xiaojun Deng, Shandong (CN)

(73) Assignee: CRRC QINGDAO SIFANG CO., LTD., Qingdao, Shandong (CN)

( * ) Notice: Subject to any disclaimer, the term of this patent is extended or adjusted under 35 U.S.C. 154(b) by 1024 days.

(21) Appl. No.: 15/119,318

(22) PCT Filed: Sep. 22, 2015

(86) PCT No.: PCT/CN2015/090249
§ 371 (c)(1),
(2) Date: Aug. 16, 2016

(87) PCT Pub. No.: WO2016/045572
PCT Pub. Date: Mar. 31, 2016

(65) Prior Publication Data
US 2018/0173830 A1    Jun. 21, 2018

(30) Foreign Application Priority Data

Sep. 26, 2014   (CN) .......................... 2014 1 0502593

(51) Int. Cl.
| | | |
|---|---|---|
| *G06F 30/23* | (2020.01) |
| *B32B 27/08* | (2006.01) |
| *B32B 27/36* | (2006.01) |
| *B32B 27/40* | (2006.01) |
| *C09D 167/00* | (2006.01) |
| *C09D 175/04* | (2006.01) |
| *C09D 5/00* | (2006.01) |
| *C25D 11/02* | (2006.01) |
| *C25D 11/04* | (2006.01) |
| *G06F 30/15* | (2020.01) |
| *C09D 5/08* | (2006.01) |

(52) U.S. Cl.
CPC .............. *G06F 30/23* (2020.01); *B32B 27/08* (2013.01); *B32B 27/36* (2013.01); *B32B 27/40* (2013.01); *C09D 5/002* (2013.01); *C09D 167/00* (2013.01); *C09D 175/04* (2013.01); *C25D 11/026* (2013.01); *C25D 11/04* (2013.01); *C09D 5/08* (2013.01); *G06F 30/15* (2020.01)

(58) Field of Classification Search
CPC ......... G06F 30/23; G06F 30/15; C25D 11/04; C25D 11/026; C09D 5/002; C09D 175/04; C09D 167/00; C09D 5/08; B32B 27/40; B32B 27/36; B32B 27/08
See application file for complete search history.

(56) References Cited

U.S. PATENT DOCUMENTS

| | | | | |
|---|---|---|---|---|
| 6,472,465 | B1 * | 10/2002 | Hille ..................... | B05D 7/57 427/372.2 |
| 2006/0177639 | A1 * | 8/2006 | Elzen .................... | B05D 7/572 428/213 |

FOREIGN PATENT DOCUMENTS

| | | | | |
|---|---|---|---|---|
| CN | 101306418 | * | 11/2008 | ............... B05D 3/00 |
| CN | 101306418 | A | 11/2008 | |
| CN | 101456012 | * | 6/2009 | ............... B05D 1/36 |
| CN | 101456012 | A | 6/2009 | |
| CN | 101683643 | A | 3/2010 | |
| CN | 103643278 | A | 3/2014 | |
| CN | 103757681 | A | 4/2014 | |
| CN | 104325733 | A | 2/2015 | |
| KR | 20030083066 | A | 10/2003 | |

OTHER PUBLICATIONS

Yaming—CN 101306418 B—ISR D#2—MT—anti-ablation composite coating on alloy—2008 (Year: 2008).*
Bangcheng—CN 101456012 B—ISR D#1—MT—paint method for high-speed trains—2009 (Year: 2009).*
International Search Report for PCT/CN2015/090249, dated Dec. 21, 2015, ISA/CN.

* cited by examiner

*Primary Examiner* — Saif A Alhija
(74) *Attorney, Agent, or Firm* — Yue (Robert) Xu; Apex Attorneys at Law, LLP

(57) ABSTRACT

A vehicle body composite coating, comprising, in succession, a polyurethane finishing coat, a polyurethane intermediate layer, a polyester putty and a micro-arc oxidation ceramic layer undercoat, wherein the micro-arc oxidation ceramic layer undercoat is on an aluminium substrate of the vehicle body. The design method of the vehicle body composite coating includes establishment of a physical model, selection of an optimal thickness ratio, preparation of the vehicle body composite coating and an erosion test. The vehicle body composite coating enhances the binding force between the whole coating system and the aluminium alloy substrate, reduces the possibility of shedding of the coating as a whole, and improves the anti-erosion performance of the vehicle body composite coating.

5 Claims, No Drawings

VEHICLE BODY COMPOSITE COATING AND DESIGN METHOD THEREOF

CROSS REFERENCE OF RELATED APPLICATION

The present application is a national phase of International Application No. PCT/CN2015/090249, titled "VEHICLE BODY COMPOSITE COATING AND DESIGN METHOD THEREOF", filed on Sep. 22, 2015, which claims the priority of a Chinese patent application No. 201410502593.1 entitled "VEHICLE BODY COMPOSITE COATING AND DESIGN METHOD THEREOF", filed with the Chinese Patent Office on Sep. 26, 2014, the entire content of which is incorporated herein by reference.

FIELD

The present invention relates to the technical field of railway vehicle coating design, and in particular to a vehicle body composite coating which can improve the ability of the motor train unit head resistant to the erosion of high-speed fine particles, and a design method thereof.

BACKGROUND

Erosion and particle invasion will occur when the surface of a motor train unit head is impacted by fine particles in a high speed, both of which would roughen the vehicle body surface. This would not only increase the air friction resistance of the railway vehicles during running, but also enhance the absorption capacity of the vehicle body surface, such that living beings (such as mosquitoes, etc.) are easier to be adsorbed, and the surface materials on the railway vehicles have a reduced lifetime and are difficult to be cleaned.

The composite coating in the prior art is a coating system of a polyurethane topcoat, a polyurethane intermediate layer, a polyester putty and an epoxy resin primer, in which the superficial coat is easily to be destroyed and the coating is easily to be shed as a whole when the coating system is impacted by fine particles. Accordingly, there is a need for a novel coating system to improve the anti-erosion performance.

SUMMARY

(I) Technical Problem to be Solved

The object of the present invention is to provide a vehicle body composite coating and a design method thereof, so as to overcome the problem that the composite coating in the prior art has a poor anti-erosion performance.

(II) Technical Solution

To solve the above technical problem, the present invention provides a vehicle body composite coating, comprising, in succession, a polyurethane topcoat, a polyurethane intermediate layer, a polyester putty and a micro-arc oxidation ceramic primer, wherein the micro-arc oxidation ceramic primer is coated on an aluminium substrate of the vehicle body.

Preferably, the polyurethane topcoat has a thickness of 95 micrometers (µm)~105 µm, the thickness ratio between the polyurethane topcoat and the polyurethane intermediate layer is 1.5:1~2:1, the polyester putty has a thickness of 1 µm~2 µm, and the micro-arc oxidation ceramic primer has a thickness of 55 µm~65 µm.

Preferably, the micro-arc oxidation ceramic layer is coated on the aluminium substrate of the vehicle body by means of spraying micro-arc oxidation.

The present invention further provides a design method for the vehicle body composite coating, comprising the steps of:

S1. establishing a physical model based on the vehicle body composite coating, calculating the dynamic response of the vehicle body composite coatings with different thickness ratios under impact, and evaluating the anti-erosion capacity of the vehicle body composite coating by employing the element removal amount of the superficial coat—the polyurethane topcoat as well as the peeling force between the aluminium substrate of the vehicle body and the micro-arc oxidation ceramic primer as a standard;

S2. selecting an optimal thickness ratio of the vehicle body composite coating based on the result of the calculation;

S3. preparing the vehicle body composite coating on the aluminium substrate of the vehicle body according to the optimal thickness ratio;

S4. performing an erosion test on the vehicle body composite coating, and comparing the anti-impact performance between the vehicle body composite coating and the original composite coating to verify the optimal thickness ratio of the vehicle body composite coating.

Preferably, the physical model is established by a finite element software Ansys/LS-DYNA.

Preferably, rigid pellets are selected as impacting particles in the physical model, a Johnson-Cook constitutive model is selected for the polyurethane topcoat, and an elastoplastic constitutive model is selected for the polyurethane intermediate layer, the polyester putty and the micro-arc oxidation ceramic primer.

Preferably, the impacting particles are pellets with a diameter of 95 µm~105 µm, the speed is 90 m/s~110 m/s and the erosion angle is selected at 25°~35°.

Preferably, the element removal amount of the polyurethane topcoat is calculated based on the cumulative damage rule, wherein the plastic strain of all the elements is calculated for each time step during the calculation, an element is removed when its plastic strain reaches a damage critical value in the calculation, and the element removal amount is counted after the calculation is completed.

Preferably, the peeling force between the aluminium substrate of the vehicle body and the micro-arc oxidation ceramic primer is a resultant force of the interfacial tensile stress and shear stress between the aluminium substrate and the micro-arc oxidation ceramic primer when calculated, and the resultant force is used to characterize the peeling force in an impact process.

Preferably, the erosion test of the vehicle body composite coating is carried out using a sandblasting erosion abrasion test system, wherein the weight loss of the vehicle body composite coating is measured, and the surface topography and interface damage thereof are observed.

(III) Advantageous Effects

The vehicle body composite coating of the present invention is based on the coating system of a polyurethane topcoat, a polyurethane intermediate layer, a polyester putty and an epoxy resin primer, wherein the epoxy resin primer is changed to a micro-arc oxidation ceramic primer, which effectively increases the binding force between the whole coating system and the aluminium alloy substrate, and effectively reduces the possibility of shedding of the coating as a whole in the erosion process during running. Meanwhile, the thickness of each part of the vehicle body composite coating is matched in an optimal thickness ratio, thereby effectively improving the anti-erosion performance thereof.

DETAILED DESCRIPTION

Hereinafter, the technical solutions in the embodiments of the present invention will be described clearly and fully, and obviously, they are only part of embodiments in the present invention, and are not all embodiments in the present invention. Based on the embodiments in the present invention, all other embodiments which can be obtained by those of ordinary skill in the art without any creative efforts fall into the scope of the present invention.

The vehicle body composite coating of the present embodiment comprises in succession (from outside inwards): a polyurethane topcoat, a polyurethane intermediate layer, a polyester putty and a micro-arc oxidation ceramic primer, wherein the micro-arc oxidation ceramic primer is coated on an aluminium substrate of the vehicle body.

In the present invention, the micro-arc oxidation ceramic primer is grown on the surface of the vehicle head using a spraying micro-arc oxidation process, which is suitable for the surface ceramization operations of large workpieces, and can meet the spraying requirements of the ceramic primer in the motor train unit head. It is measured according to the tests that a ceramic coating prepared on a 5083 aluminium alloy substrate has a binding force up to 100 N, which is far larger than the binding strength between the epoxy resin primer and the substrate. In addition, by adjusting the process parameters of spraying, the surface topography and surface roughness of the ceramic coating can be changed, and the attachment force of the polyester putty on the surface thereof can be significantly increased. The growth of the ceramic coating with a spraying micro-arc oxidation process can effectively solve the problem that the vehicle head is difficult to be processed due to its large size.

The polyurethane topcoat has a thickness of 95 μm~105 μm, the thickness ratio between the polyurethane topcoat and the polyurethane intermediate layer is 1.5:1~2:1, the polyester putty has a thickness of 1 μm~2 μm, and the micro-arc oxidation ceramic primer has a thickness of 55 μm~65 μm.

The design method for the vehicle body composite coating of the present embodiment comprises the steps S1~S4.

In S1, a physical model is established based on the vehicle body composite coating, and the dynamic response of the vehicle body composite coatings with different thickness ratio under impact is calculated, and the anti-erosion capacity of the vehicle body composite coating is evaluated by employing the element removal amount of the superficial coat—the polyurethane topcoat as well as the peeling force between the aluminium substrate of the vehicle body and the micro-arc oxidation ceramic primer as a standard.

The physical model consists of two parts: particles; as well as a coating system of a polyurethane topcoat, a polyurethane intermediate layer, a polyester putty and a micro-arc oxidation ceramic primer.

The physical model is established by a finite element software Ansys/LS-DYNA. In the physical model, rigid materials (without concerning the deformation of the pellets when the impact is calculated) are selected for the impacting particles, in particular rigid pellets; flexible materials are selected for the polyurethane topcoat, in particular a Johnson-Cook constitutive model; and an elastoplastic constitutive model is selected for the polyurethane intermediate layer, the polyester putty and the micro-arc oxidation ceramic primer.

The impacting particles are pellets with a diameter of 95 μm~105 μm, and have a speed of 90 m/s~110 m/s and an erosion angle selected at 25° ~35°. It is preferred in the present embodiment that the particles are pellets with a diameter of 100 μm (it is shown from the statistical data for grains of sand in the sand and dust of the North that more than 85% grains of sand have a particle size of 74 μm~250 μm), and have a speed of 100 m/s (being similar to the speed of the motor train) and an erosion angle selected at 30°; and the coating system is 60 μm of the polyurethane topcoat+40 μm of the polyurethane intermediate layer+3 mm of the polyester putty+60 μm of the micro-arc oxidation ceramic primer.

In the physical model, the coating is impacted by the particles in a speed of 100 m/s. The kinetic energy of the particles makes the coating deformed (impact dynamics theory), without concerning the deformation of the particles. The stress of the coating is calculated according to the selected material constitutive model, and accordingly, the stress and the strain distribution of the coating are calculated.

The mentioned calculation is an explicit dynamic calculation, wherein the model is discretized into minor finite elements, the stress and strain of all the elements are calculated for each time step during the calculation, and the stress-strain distribution state of the whole coating system is finally obtained.

The element removal amount of the polyurethane topcoat is calculated based on the cumulative damage rule, wherein the plastic strain of all the elements is calculated for each time step during the calculation, an element is removed when its plastic strain reaches a damage critical value in the calculation, and the element removal amount is counted after the calculation is completed.

The peeling force between the aluminium substrate of the vehicle body and the micro-arc oxidation ceramic primer is a resultant force of the interfacial tensile stress and shear stress between the aluminium substrate and the micro-arc oxidation ceramic primer when calculated, and such a resultant force is used to characterize the peeling force in an impact process.

The calculation results show that the element failure is focused on the polyurethane topcoat, and an optima effect is achieved when the thickness ratio between the polyurethane topcoat and the polyurethane intermediate layer is between 1.5:1 and 2:1; compared to the original coating system, there is a difference within 10% in the effect on the superficial coat and primer when the thickness of the polyester putty is reduced by half and controlled at 1-2 mm; there is a small peeling force (within the order of KPa) in the impact process when the micro-arc oxidation ceramic primer has a thickness of 60 μm.

In S2, based on the result of the above calculation, an optimal thickness ratio of the vehicle body composite coating is selected and determined.

In S3, the vehicle body composite coating on the aluminium substrate of the vehicle body is prepared according to the optimal thickness ratio.

In S4, an erosion test on the vehicle body composite coating is performed, and the anti-impact performance between the vehicle body composite coating and the original composite coating is compared to determine the optimal thickness ratio of the vehicle body composite coating.

The erosion test is carried out on the vehicle body composite coating using a sandblasting erosion abrasion test system, wherein the weight loss of the vehicle body composite coating is measured, and the surface topography and interface damage thereof are observed.

In the mentioned erosion test, $SiO_2$ sands of 150 mesh are used as particles, the injection pressure is controlled around 190 KPa (the corresponding particle speed is 100 m/s), the erosion angle is 30°, and the erosion time is 30 s. After the test is completed, the weight loss of the coating is measured using a precision balance with a precision of 0.1 mg, and the surface topography and interface damage thereof are observed by a scanning electron microscope.

The test results show that, there is no obvious change in the erosion abrasion ratio of the coating when the thickness of the polyester putty is reduced to 1-2 mm; the anti-erosion abrasion performance of the coating is apparently improved when the thickness ratio between the polyurethane topcoat and the polyurethane intermediate layer is between 1.5:1 and 2:1 and the micro-arc oxidation ceramic layer has a thickness of around 60 μm. No shedding occurs for the novel coating as a whole, indicating that the ceramic layer primer exhibits a significant effect. The measured erosion abrasion ratio of the original coating system is 0.291 mm3/g and the novel coating system is around 0.075 mm3/g, and thus the anti-erosion capacity of the novel coating system is increased more than three times.

In the present invention, the polyurethane topcoat/polyurethane intermediate layer/polyester putty/micro-arc oxidation ceramic layer/aluminium substrate model is established using the finite element software Ansys/LS-DYNA, the stress-strain distribution state of the composite coating with a different thickness ratio under impact is calculated, with the stress and plastic strain accumulation of the superficial coat surface element, as well as the tensile stress and shear stress between the micro-arc oxidation ceramic layer and the aluminium substrate being mainly investigated. This can be achieved by the following steps: 1) setting the plastic strain critical value of the coating element removal to 0.2 in the analog computation according to the existing analysis for the polyurethane coating; 2) counting the number of particles needed when the plastic strain of the coating element reaches 0.2 according to the early calculation; and 3) calculating the erosion volume and abrasion ratio thereof based on the computational formula $$Ev = \frac{\Delta V}{m_p}$$

wherein $\Delta V$ is the coating element removal volume, which is calculated from the coating element removal number and the length of the element, and mp is the mass of the particles, which is calculated from the particle number and the mass of a single particle. The results show that: the plastic strain accumulation of the polyurethane topcoat element is associated with not only its thickness, but also that of the intermediate coat. When the thickness ratio between the polyurethane topcoat and the intermediate layer is between 1.5:1 and 2:1, the damage value of the particle impact for the subsurface layer of the topcoat is minimized, so is the corresponding Ev; when the polyester putty has a thickness of 1-2 mm, the effect of the stress wave transmission on the primer and substrate caused by particle impacting is within the order of KPa.

In practical applications, specific examples of the above design method can be as follows.

Example 1

The explicit dynamic analysis module LS-DYNA in a software Ansys was opened to establish a composite coating model, wherein the polyurethane topcoat, polyurethane intermediate layer, polyester putty, micro-arc oxidation ceramic layer had a thickness of 60 μm, 40 μm, 3 mm, 60 μm, respectively. A solid 164 solid element was selected as the element, and a Johnson-Cook model under the Gruneisen state equation was selected as the material model; a $SiO_2$ rigid model (pellets with a diameter of 100 μm) was selected for the particles, of which the injection speed was initially set to be 100 m/s, and the injection angle was selected to be 300 (being close to the dip angle of the motor train unit head); an erosion contacting relationship was provided between the particles and the coatings, a connection/failure relationship was provided between the coatings, and failure critical values in both directions were input. The calculation was started and lasted for a period of 10 microseconds (μs), and then the surface tensile stress of the interfacial coat, the shear stress between upper and lower interface surfaces of the intermediate layer, the coating deformation as well as the detachment between elements and the element removal were checked when the calculation was completed. The polyurethane topcoat, polyurethane intermediate layer, polyester putty, micro-arc oxidation ceramic layer were prepared on the vehicle head material to a thickness of 60 μm, 40 μm, 3 mm, 60 μm, respectively, and subjected to a test using a sandblasting erosion abrasion test system developed by ourselves. Then, the weight loss of the coating was measured, and the surface topography and interface damage thereof were observed.

Example 2

Example 2 differed from Example 1 in that the thickness of the polyester putty was changed to 1 mm and 2 mm, and two calculations were performed for each. Moreover, the surface tensile stress of the interfacial coat, the shear stress between upper and lower interface surfaces of the intermediate layer, the coating deformation as well as the detachment between elements and the element removal were checked when the calculations were completed, and were compared to that of Example 1. The composite coatings were prepared by changing the thickness of the polyester putty to 1 mm and 2 mm respectively and subjected to a test using a sandblasting erosion abrasion test system developed by ourselves. Then, the weight loss of the coating was measured, and the surface topography and interface damage thereof were observed.

Example 3

Example 3 differed from Example 1 in that the thickness of the polyester putty layer was changed to 1 mm, and the thickness ratio between the polyurethane topcoat and the polyurethane intermediate layer was adjusted. Calculations were performed respectively, and then the surface tensile stress of the interfacial coat, the shear stress between upper and lower interface surfaces of the intermediate layer, the coating deformation as well as the detachment between elements and the element removal were checked when the calculations were completed. The composite coatings were prepared by changing the thickness of the polyester putty layer to 1 mm and adjusting the thickness ratio between the polyurethane topcoat and the polyurethane intermediate layer respectively, and subjected to a test using a sandblasting erosion abrasion test system developed by ourselves. Then, the weight loss of the coating was measured, and the surface topography and interface damage thereof were observed.

The vehicle body composite coating of the present invention is based on the coating system of a polyurethane topcoat, a polyurethane intermediate layer, a polyester putty and an epoxy resin primer, wherein the epoxy resin primer is changed to a micro-arc oxidation ceramic primer, which effectively enhances the binding force between the whole coating system and the aluminium alloy substrate, reduces the possibility of shedding of the coating as a whole in the erosion process during running. Meanwhile, the thickness of each part of the vehicle body composite coating is adjusted according to the optimal thickness ratio, which effectively improves the anti-erosion performance of the vehicle body composite coating.

The examples of the present invention have been presented for purposes of illustration and description, which are not exhaustive or intended to limit the present invention to the disclosed forms. Many modifications and variations will be obvious for those of ordinary skill in the art. The examples were chosen and described in order to better explain the principles and practical applications of the invention, and to enable those of ordinary skill in the art to understand the invention, thus designing various embodiments with various modifications which are suited to particular uses.

The invention claimed is:

1. A design method for a vehicle body composite coating, characterized in that the vehicle body composite coating comprises, in succession, a polyurethane topcoat, a polyurethane intermediate layer, a polyester putty and a micro-arc oxidation ceramic primer, wherein the micro-arc oxidation ceramic primer is coated on an aluminium substrate of the vehicle body, the method comprises the steps of:
   S1. establishing a physical model based on the vehicle body composite coating, calculating a dynamic response of the vehicle body composite coatings with different thickness ratios under impact, and evaluating an anti-erosion capacity of the vehicle body composite coating by employing an element removal amount of the superficial coat—the polyurethane topcoat as well as a peeling force between the aluminium substrate of the vehicle body and the micro-arc oxidation ceramic layer as standards;
   S2. selecting an optimal thickness ratio of the vehicle body composite coating based on the result of the calculation;
   S3. preparing the vehicle body composite coating on the aluminium substrate of the vehicle body according to the optimal thickness ratio;
   S4. performing an erosion test on the vehicle body composite coating, and comparing an anti-impact performance between the vehicle body composite coating and an original composite coating to determine the optimal thickness ratio of the vehicle body composite coating.

2. The design method according to claim 1, characterized in that in the physical model, rigid pellets are selected as impacting particles, a Johnson-Cook constitutive model is selected for the polyurethane topcoat, and an elastoplastic constitutive model is selected for the polyurethane intermediate layer, the polyester putty and the micro-arc oxidation ceramic primer.

3. The design method according to claim 2, characterized in that the impacting particles are pellets with a diameter of 95 μm~105 μm, and having a speed of 90 m/s~110 m/s, and an erosion angle is selected to be 25°~35°.

4. The design method according to claim 2, characterized in that the element removal amount of the polyurethane topcoat is calculated based on a cumulative damage rule, wherein a plastic strain of all the elements is calculated for each time step during the calculation, an element is removed when its plastic strain reaches a damage critical value in the calculation, and the element removal amount is counted after the calculation is completed.

5. The design method according to claim 2, characterized in that the peeling force between the aluminium substrate of the vehicle body and the micro-arc oxidation ceramic primer is a resultant force of the interfacial tensile stress and shear stress between the aluminium substrate and the micro-arc oxidation ceramic primer when calculated, and the resultant force is used to characterize the peeling force in an impact process.

* * * * *